United States Patent
Chan et al.

(10) Patent No.: US 7,287,919 B2
(45) Date of Patent: Oct. 30, 2007

(54) DEVELOPING PROCESS AND APPARATUS

(75) Inventors: Hsun-Kai Chan, Keelung (TW); Ta-Yu Liu, Taipei (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 162 days.

(21) Appl. No.: 11/148,607

(22) Filed: Jun. 8, 2005

(65) Prior Publication Data

US 2006/0280501 A1  Dec. 14, 2006

(51) Int. Cl.
*G03D 5/06* (2006.01)
*G03D 5/00* (2006.01)

(52) U.S. Cl. .................. 396/611; 396/604; 396/627; 118/52; 430/5

(58) Field of Classification Search ........... 396/611, 396/627
See application file for complete search history.

(56) References Cited

FOREIGN PATENT DOCUMENTS

| JP | 09276773 | * 10/1997 |
| JP | 2001176786 | * 6/2001 |

* cited by examiner

*Primary Examiner*—D. Rutledge
(74) *Attorney, Agent, or Firm*—J.C. Patents

(57) ABSTRACT

The invention discloses a developing apparatus and a developing process. Wherein the developing process comprises following steps. First, a developing apparatus and a substrate are provided, wherein the developing apparatus comprises a conveyer and a nozzle. Then, the substrate is conveyed along a first direction by the conveyer, and the nozzle is driven to move along a second direction opposite to the first direction, wherein the nozzle sprays a developer over the substrate as moving. As mentioned above, the non-uniformity of development can be reduced.

11 Claims, 1 Drawing Sheet

DEVELOPING PROCESS AND APPARATUS

BACKGROUND OF THE INVENTION

1. Field of the Invention

The present invention generally relates to a manufacturing process and an apparatus of semiconductor. More particularly, the present invention relates to a developing process and a developing apparatus.

2. Description of Related Art

Being an important process in the manufacturing of semiconductor, the photolithography mainly comprises steps of photo-resist coating, exposing, and developing. In a developing process, mainly processing conditions comprise the time of development, the concentration of developer, and the temperature.

FIG. 1 is a schematic view illustrating a conventional developing process. Referring to FIG. 1, the conventional developing process comprises following steps. First, a developer supplying device 102 and a substrate 100 are provided, wherein one terminal of the developer supplying device 102 is connected with a pipe 104 for providing developer into the developer supplying device 102. In addition, the developer supplying device 102 comprises multiple nozzles (not shown) for spraying the developer. Than, the developer supplying device 102 moves above the substrate 100 from one side to another side and sprays the developer over the substrate 100 simultaneously. Next, the developer on the substrate 100 is removed for completing the conventional developing process.

It should be noticed that the developer supplying device takes few seconds for moving above the substrate from one side to another side, thus a few seconds difference exists as spraying the developer over the two sides of the substrate. The few seconds' difference may cause the non-uniformity of development as spraying developer over a substrate in greater size. In other words, the enlargement of the substrate aggravates the problem of the non-uniformity of development.

SUMMARY OF THE INVENTION

Accordingly, the present invention is directed to a developing process, which reducing the non-uniformity of development.

In addition, the present invention also directed to a developing apparatus, which provides superior developing effect to a large scale substrate.

The present invention provides a developing process comprising the following steps. First, a developing apparatus and a substrate are provided, wherein the developing apparatus comprises a conveyer and a nozzle. Then, the substrate is conveyed along a first direction by the conveyer, and the nozzle is driven to move along a second direction opposite to the first direction, wherein the nozzle sprays a developer over the substrate as moving.

The present invention also provides a developing apparatus, which is suitable for performing a developing process to a substrate. The developing apparatus comprises: a conveyer, conveying the substrate along a first direction; and a nozzle, disposed above the conveyer for spraying a developer. Wherein, as the substrate is conveyed along the first direction, the nozzle is driven to move along a second direction opposite to the first direction and sprays the developer over the substrate.

According to an embodiment of the present invention, the flow rate of the developer is between 30L/min and 50L/min.

According to an embodiment of the present invention, the concentration of the developer is between 2.37% and 2.39%.

According to an embodiment of the present invention, the temperature of the developer is between 22° C. and 24° C.

According to an embodiment of the present invention, the nozzle moves at a speed between 2 m/min and 9 m/min.

According to an embodiment of the present invention, the substrate moves at a speed between 2 m/min and 9 m/min.

According to an embodiment of the present invention, the developing process further comprises a step of removing the developer on the substrate after spraying the developer by the nozzle. In addition, the method for removing the developer comprises performing a cleaning process.

Since the substrate and the nozzle move simultaneously as spraying the developer, the developing process of the present invention not only reduce the time of spraying but decrease the usage of the developer. Furthermore, to the substrate in greater size, the problem of the non-uniformity of development can be substantially solved according to the present invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
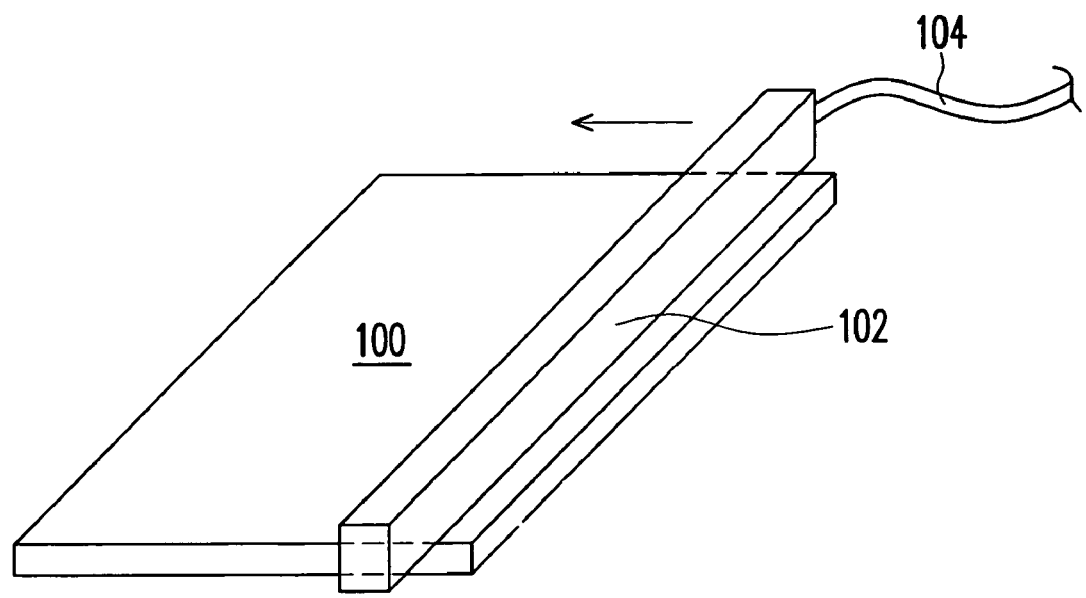
FIG. 1 is a schematic view illustrating a conventional developing process.

Reference will now be made in detail to the present preferred embodiments of the invention, examples of which are illustrated in the accompanying drawings. Wherever possible, the same reference numbers are used in the drawings and the description to refer to the same or like parts.

Figure 2:
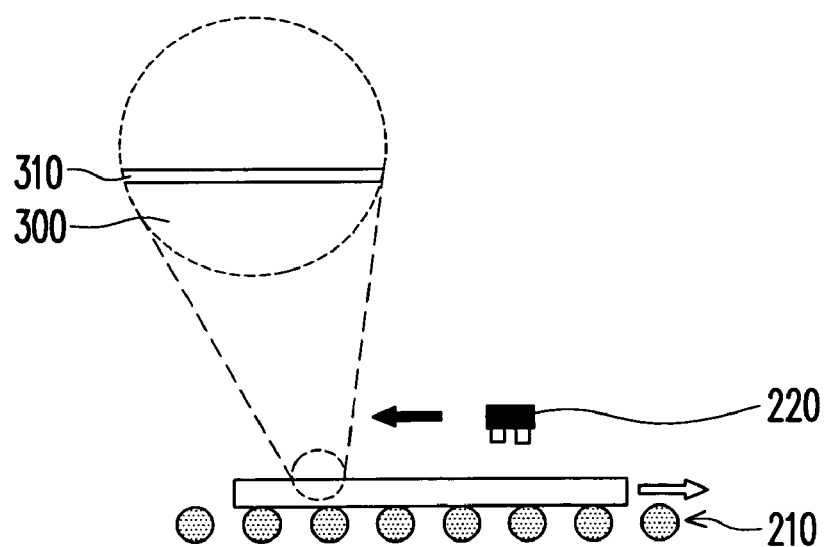
FIG. 2 is a schematic view illustrating a developing process according to a preferred embodiment of the present invention.

FIG. 2 is a schematic view illustrating a developing process according to a preferred embodiment of the present invention. The developing process comprises following steps. First, a substrate 300 is disposed on a conveyer 210 of a developing apparatus 200, wherein a photo-resist layer 310 has been formed on the substrate 300. In the embodiment, the conveyer 210 conveys the substrate 300 by a plurality of rollers. However, the conveyer 210 can also conveys the substrate 300 by a tray, a robot, or other manners. In addition, a nozzle 220 of the developing apparatus 200 is used for spraying the developer. And, a developer supplying device is also provided for providing the developer to the nozzle 220.

As the developing process begins, the substrate 300 is conveyed along a first direction by the conveyer 210, and the nozzle is driven to move along a second direction opposite to the first direction. In other words, the nozzle 220 and the substrate 300 move simultaneously and in opposite directions respectively. In addition, the nozzle 220 sprays the developer over the substrate 300 as moving to remove a portion of the photo-resist layer 310. For example, if the material of the photo-resist layer 310 is a positive type photo-resist, the unexposed portion thereof is removed by the developer, and as for a negative type photo-resist, the exposed portion thereof is removed instead.

In more detail, the nozzle 220 moves at a speed between 2 m/min and 9 m/min, and the substrate 310 moves at a speed between 2 m/min and 9 m/min. According to the size of the substrate 310, the moving speeds of the nozzle 220 and the substrate 310 can be adjusted as preferred. Actually, the moving speed of the nozzle 220 is usually greater than the moving speed of the substrate 310, thus the initial position of the nozzle 220 should be adjusted to prevent the non-uniformity of development and reduce the consumption of the developer. In addition, the flow rate of the developer is, for example, between 30L/min and 50L/min. The concentration of the developer is, for example, between 2.37% and 2.39%, preferably 2.38%. The temperature of the developer is, for example, between 22° C. and 24° C., preferably 23° C.

After spraying the developer and passing through a reaction time, a cleaning process or other preferred processes are then performed to the substrate 300 for removing the remaining developer and the reactant. The reaction time is the time needed for completing the reaction between the developer and the substrate 310. Besides, in the process of spraying the developer, an air-extraction is usually performed in the developing apparatus 200 to prevent the pollution of the reactant.

Accordingly, the substrate and the nozzle move simultaneously in the developing process of the present invention, so that the spraying time of the developer can be reduced, and the problem of the non-uniformity of development can be drastically solved. In addition, to the substrate in greater size, the developing process of the present invention can further save the consumption of the developer and improve the effect of the development.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A developing process, comprising:
   providing a developing apparatus and a substrate, wherein the developing apparatus comprises a conveyer and a nozzle; and
   conveying the substrate along a first direction by the conveyer, and driving the nozzle to move along a second direction opposite to the first direction, wherein the nozzle sprays a developer over the substrate as moving, and the nozzle moves at a speed between 2 m/min and 9 m/min.

2. The developing process according to claim 1, wherein the flow rate of the developer is between 30L/min and 50L/min.

3. The developing process according to claim 1, wherein the concentration of the developer is between 2.37% and 2.39%.

4. The developing process according to claim 1, wherein the temperature of the developer is between 22° C. and 24° C.

5. The developing process according to claim 1, wherein the substrate moves at a speed between 2 m/min and 9 m/min.

6. The developing process according to claim 1, further comprising a step of removing the developer on the substrate after spraying the developer by the nozzle.

7. The developing process according to claim 6, wherein the method for removing the developer comprises performing a cleaning process.

8. An developing apparatus, which is suitable for performing a developing process to a substrate, comprising:
   a conveyer, conveying the substrate along a first direction; and
   a nozzle, disposed above the conveyer for spraying a developer, wherein as the substrate is conveyed along the first direction, the nozzle is driven to move along a second direction opposite to the first direction and sprays the developer over the substrate, and the nozzle moves at a speed between 2 m/min and 9 m/min.

9. The developing apparatus according to claim 8, wherein the flow rate of the developer is between 30 L/min and 50 L/min.

10. The developing apparatus according to claim 8, wherein the temperature of the developer is between 22° C. and 24° C.

11. The developing apparatus according to claim 8, wherein the substrate moves at a speed between 2 m/min and 9 m/min.

* * * * *